(12) United States Patent
Kobayashi et al.

(10) Patent No.: US 8,610,268 B2
(45) Date of Patent: Dec. 17, 2013

(54) SEMICONDUCTOR ELEMENT, SEMICONDUCTOR ELEMENT MOUNTED BOARD, AND METHOD OF MANUFACTURING SEMICONDUCTOR ELEMENT

(75) Inventors: Kazutaka Kobayashi, Nagano (JP); Tadashi Arai, Nagano (JP); Takashi Kurihara, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 138 days.

(21) Appl. No.: 13/223,531

(22) Filed: Sep. 1, 2011

(65) Prior Publication Data

US 2012/0074578 A1    Mar. 29, 2012

(30) Foreign Application Priority Data

Sep. 24, 2010   (JP) ................................. 2010-213688

(51) Int. Cl.
*H01L 23/52*     (2006.01)
*H01L 23/48*     (2006.01)

(52) U.S. Cl.
USPC .................... 257/737; 257/778; 257/E23.021

(58) Field of Classification Search
USPC .................................. 257/737, E23.021, 778
See application file for complete search history.

(56) References Cited

U.S. PATENT DOCUMENTS

| | | | | |
|---|---|---|---|---|
| 5,607,877 A | * | 3/1997 | Matsuda et al. | 438/613 |
| 5,959,362 A | * | 9/1999 | Yoshino | 257/778 |
| 6,061,248 A | * | 5/2000 | Otani et al. | 361/777 |
| 6,492,197 B1 | * | 12/2002 | Rinne | 438/108 |

FOREIGN PATENT DOCUMENTS

JP            5-218138         8/1993

\* cited by examiner

*Primary Examiner* — Nitin Parekh
(74) *Attorney, Agent, or Firm* — Kratz, Quintos & Hanson, LLP

(57) ABSTRACT

A semiconductor element includes connection terminals. The connection terminals are each shaped in such a manner that the transverse cross-sectional area in a portion near the leading end thereof decreases toward the leading end. Specifically, the shape of each of the connection terminals is columnar except for the portion near the leading end, and the side surface in the portion near the leading end of the connection terminal is shaped in a tapered form. Furthermore, a metal layer for improving a solder wettability may be formed at least on the side surface shaped in the tapered form, of the connection terminal.

5 Claims, 10 Drawing Sheets

EMBODIMENT

FIG. 1A EMBODIMENT
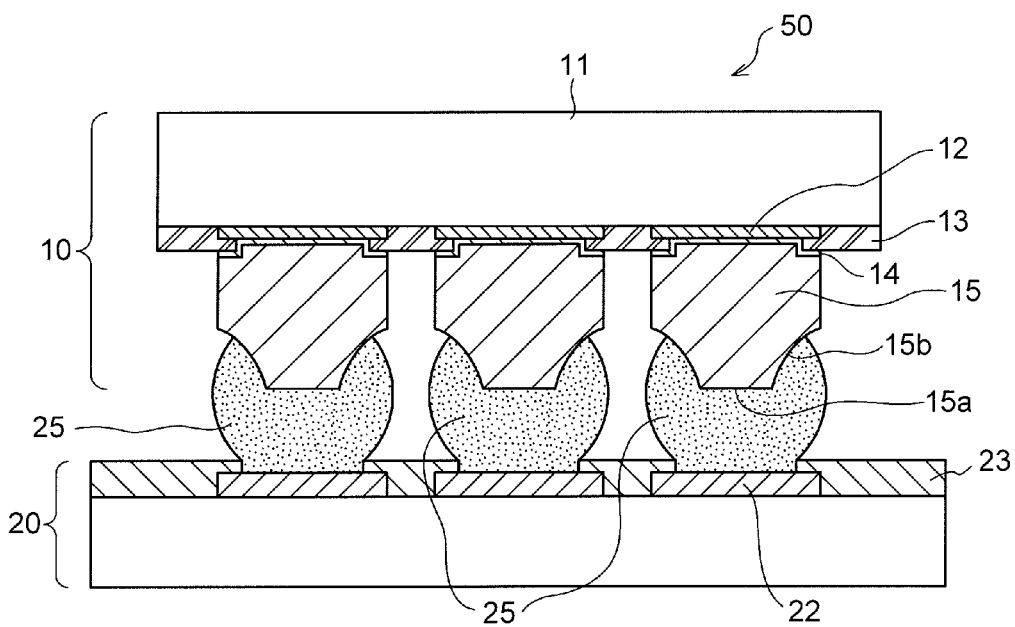
FIG. 1B COMPARATIVE EXAMPLE
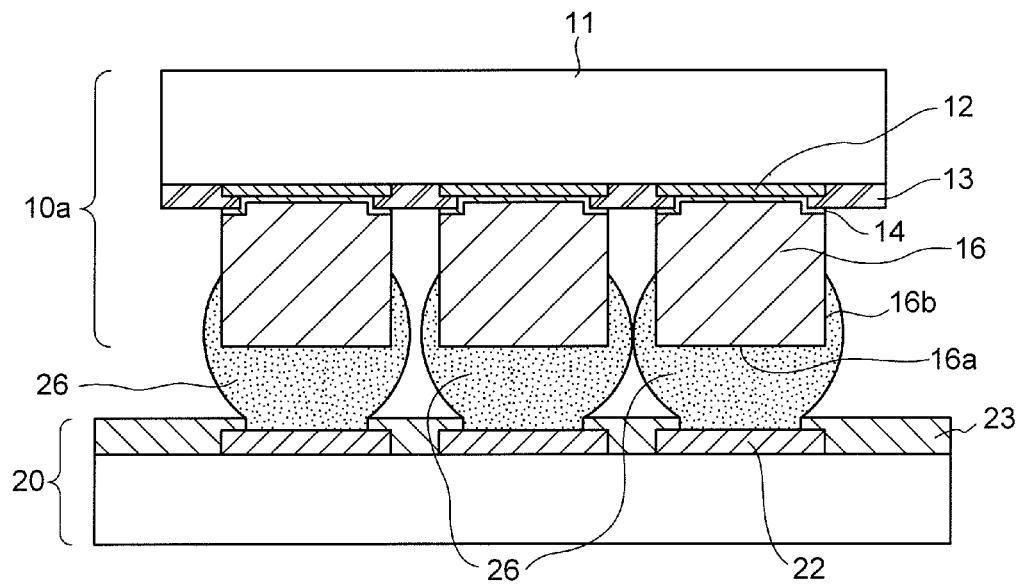

SEMICONDUCTOR ELEMENT, SEMICONDUCTOR ELEMENT MOUNTED BOARD, AND METHOD OF MANUFACTURING SEMICONDUCTOR ELEMENT

CROSS-REFERENCE TO RELATED APPLICATION

This application is based upon and claims the benefit of priority of the prior Japanese Patent Application No. 2010-213688, filed on Sep. 24, 2010, the entire contents of which are incorporated herein by reference.

FIELD

The embodiments discussed herein are related to a semiconductor element including a post-shaped connection terminal for connecting with a mounting board, a semiconductor element mounted board, and a method of manufacturing a semiconductor element.

BACKGROUND

A typical process of fabricating a semiconductor element including a post-shaped connection terminal (hereinafter, also referred to as a "post" for the sake of convenience) includes the following series of steps. First, a barrier metal layer is formed on a pad (e.g., an aluminum pad) of a semiconductor substrate, and a plating resist is patterned to expose the pad (barrier metal layer) therefrom. Then, a post-shaped connection terminal (post) is formed on the barrier metal layer by plating (e.g., electrolytic copper plating). Thereafter, the plating resist is removed, and an exposed portion of the barrier metal layer is etched. The shape of the post obtained in this process is columnar in many cases.

An example of the related art is described in Patent document 1 (Japanese Laid-open Patent Publication No. 5-218138).

A semiconductor element having a post-shaped connection terminal is mounted on a wiring board by flip-chip bonding. FIG. 1B illustrates an example of mounting a semiconductor element (chip) 10a having post-shaped connection terminals (posts) 16 on a wiring board 20. Here, solder 26 is attached to the connection terminal (onto the pad 22) of the board, and then, the leading end 16a of the post 16 of the chip is brought into contact with the solder 26. Thereafter, the solder 26 is melted by heating and then solidified (flip-chip bonding). During this processing, the following inconveniences occur where the shape of the post 16 is columnar in particular.

First, the solder 26 melted during the heating crawls up on the surface 16b of the post 16 from the leading end 16a thereof due to the surface tension in many cases, although depending upon the amount of the attached solder 26. In this case, the solder 26 which has crawled up on the side surface is highly likely to form a bridge between the adjacent posts 16, to thereby cause a short circuit, although depending upon the arrangement interval (pad pitch) between the posts. In the example illustrated in FIG. 1B, a "short circuit" has occurred between the two posts 16 on the right side. Moreover, even with the solder 26 crawling up on the post 16 only slightly, where the amount of the solder 26 to be attached is large, the post 16 is likely to push out the solder 26, thus still causing a short circuit to occur between the adjacent solders 26.

Meanwhile, in the case where the solder does not crawl along the side surface of the post (e.g., when the amount of the solder to be attached onto the pad is small), there arises another problem. Namely, the surface area of a portion of the post where the solder is in contact (which corresponds to the surface area of the leading end 16a of the post 16 or less in the example illustrated in FIG. 1B) becomes small as compared with the case where the solder crawls up on the side surface. AS a result, the connection reliability between the chip and the board is lowered, and an open failure is likely to occur in this case.

Moreover, in the flip-chip bonding, the solder 26 needs to be connected to the post 16 by heating and melting the solder 26 with the leading end 16a of the post 16 brought into contact with the solder 26, and then appropriately pushing the post 16 into the solder 26. However, if the posts 16 are not pushed enough, all of the posts 16 are not always brought into contact with the solder 26 because the respective heights of the solders 26 on the pads 22 of the board 20 vary. Meanwhile, if the posts 16 are pushed more than enough, the solder 26 spreads around each pad 22, and thus a bridge is formed between the adjacent solders 26. For this reason, there is a problem in that it is difficult to set an appropriate amount of the push for the post 16.

The problems mentioned above appear more notably in the semiconductor elements which are made to have a narrower pitch between pads (terminals) in particular.

SUMMARY

According to one aspect of the invention, there is provided a semiconductor element including a post-shaped connection terminal, the connection terminal having such a shape that a transverse cross-sectional area in a portion near a leading end thereof decreases toward the leading end.

According to another aspect of the invention, there is provided a semiconductor element mounted board including a semiconductor element including a post-shaped connection terminal having such a shape that a transverse cross-sectional area in a portion near a leading end thereof decreases toward the leading end, and a wiring board on which the semiconductor element is mounted via the connection terminal.

According to still another aspect of the invention, there is provided a method of manufacturing a semiconductor element, including: forming a post-shaped conductive layer on a pad of a semiconductor substrate; forming a mask on the conductive layer in such a manner that at least one of a circumferential portion of a top surface of the conductive layer and a side surface portion near the top surface thereof is exposed from the mask; and selectively removing a portion of the conductive layer which is exposed from the mask, to thereby form a post-shaped connection terminal having a transverse cross-sectional area which decreases toward the top surface of the conductive layer.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1A is a cross-sectional view illustrating a state where a semiconductor element (chip) according to an embodiment is flip-chip mounted on a wiring board, and FIG. 1B is a cross-sectional view illustrating a mounted state of a comparative example;

DESCRIPTION OF EMBODIMENTS

Figure 2A:
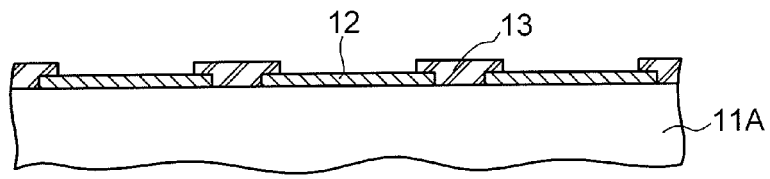
FIGS. 2A to 2E are cross-sectional views illustrating manufacturing steps of a semiconductor element (chip) according to a first embodiment.
Figure 2B:
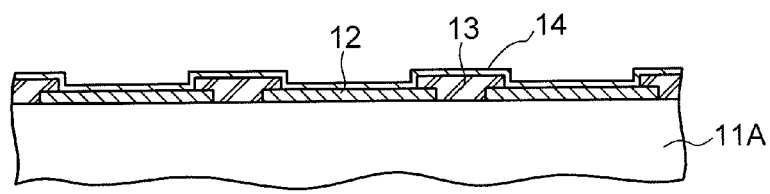

Preferred embodiments of the present invention will be explained with reference to the accompanying drawings.

(First Embodiment See FIG. 1A to FIG. 3D)

FIG. 1A illustrates in a cross-sectional view, a state where a semiconductor element (chip) according to an embodiment is flip-chip mounted on a wiring board, and FIG. 1B illustrates in a cross-sectional view, a mounted state of a comparative example.

The semiconductor element 10 (FIG. 1A) of this embodiment has a structure in which a plurality of post-shaped connection terminals 15 are vertically provided on one surface of the semiconductor substrate 11. A device is fabricated in one surface of the semiconductor substrate 11 as described later, and pads 12 are defined in portions of a wiring pattern formed on this device. A protection film 13 covers the one surface of the semiconductor substrate 11 in such a manner that the portions of the pads 12 are exposed. Furthermore, the post-shaped connection terminals (posts) 15 for connecting to a wiring board 20 via a seed layer 14 (which also serves as a barrier layer) are formed on the pads 12, respectively.

The shape of each of the post-shaped connection terminals (posts) 15 is columnar (see FIG. 10A) except for its leading end portion (the portion on the side facing the wiring board 20). In the leading end portion, a leading end 15a of the post 15 is a flat surface while a side surface 15b in a portion near the leading end 15a is shaped in a tapered form. More specifically, the post 15 is shaped in such a manner that the transverse cross-sectional area of the post 15 decreases toward the leading end 15a in the portion of the post 15, which is located near the leading end 15a. Namely, the side surface 15b shaped in the tapered form has a recessed shape curved in the axial direction of the connection terminal (post) 15 when viewed in cross section. In addition, the transverse cross-sectional shape of the post 15 is circular at any portion in the height direction thereof.

Meanwhile, in a semiconductor element 10a (FIG. 1B) illustrated as a comparative example, the shape of each of connection terminals (posts) 16 is columnar. Accordingly, the transverse cross-sectional shape of each of the posts 16 is circular at any portion in the height direction thereof, and the post 16 also has the same cross-sectional area at any portion.

Specific materials and sizes (thicknesses or the like) of the components 11 to 15 constituting the semiconductor element 10 according to this embodiment are described later in detail.

The wiring board 20 on which the semiconductor element (chip) 10 is mounted is not limited to any configuration in particular, and a board including at least an outermost wiring layer on a chip mounting surface side is sufficient. In the example illustrated in FIG. 1A, the portions of the pads 22 are defined at required positions (positions corresponding to the positions of the posts 15 of the chip 10 to be mounted thereon) of the wiring layer on the chip mounting surface side of the wiring board 20, and a solder resist layer 23 serving as a protection film is formed to cover the surface of the wiring board 20 with the pads 22 being exposed.

As illustrated in FIG. 1A, the semiconductor element (chip) 10 is electrically connected by connecting the post-shaped connection terminals (posts) 15 formed on the pads 12 (seed layer 14) respectively to the pads 22 of the board 20 via a solder 25 (flip-chip mounting). An appropriate amount of the solder 25 is previously attached to the pads 22 of the board 20 prior to the mounting of the chip 10. This flip-chip mounting forms a semiconductor element mounted structure 50. Likewise, the semiconductor element (chip) 10a is flip-chip bonded by bonding the posts 16 formed on the pads 12 (seed layer 14) respectively to the pads 22 on the wiring board 20 via a solder 26. Note that, the shapes of the bumps of the solders 25 and 26 are made different depending on the amount of solder to be attached to the pads 22 of the board 20 as well as the solder wettability of the posts 15 and 16.

Examples of the composition of the solders 25 and 26 used for flip-chip mounting include Sn-37Pb, Sn-36Pb-2Ag, Sn-3.5Ag, Sn-3Ag-0.5Cu, Sn-9Zn, Sn-8Zn-3Bi, Sn-58Bi and the like.

Note that, in the case where the wiring board is further mounted on a different mounting board (such as a motherboard) while being used as the interposer, pads and a solder resist layer which are similar to the aforementioned pads and solder resist layer are provided on a surface of the wiring board 20 on the side opposite to the chip mounting surface side. In this case, external connection terminals such as solder balls are bonded to the pads exposed from the solder resist layer, and thereby, the wiring board 20 is mounted on a motherboard or the like via the external connection terminals. As a configuration of the wiring board 20 in this case, for example, a wiring board fabricated using a build-up process (wiring board obtained by alternately stacking insulating layers formed of an epoxy-based resin or the like and conductive layers including Cu wiring or the like on both surfaces of a core substrate) can be used.

Next, a method of manufacturing the semiconductor element (chip) 10 according to the first embodiment is described with reference to FIGS. 2A to 2E and FIGS. 3A to 3D, which illustrate an example of the method.

First, in the initial step (FIG. 2A), a semiconductor substrate (semiconductor wafer) 11A, which is the object for forming post-shaped connection terminals (posts), is prepared. An example of the method of fabricating the semiconductor substrate 11A is described as follows.

To begin with, a required device process is performed on one surface side of a silicon wafer with a predetermined size (8 inches, 12 inches or the like), and a plurality of devices (each corresponding to a single semiconductor element) are thus fabricated in an array. Next, on the surface in which the devices are formed, aluminum (Al) wiring is formed on the devices in a required pattern, and the protection film (passivation film) 13 made of silicon nitride (SiN) or the like is formed in such a manner that only the portions of the pads 12 each defined in a portion of the wiring are exposed. As a wiring material, Al-1% Si-0.5% Cu, Al-2% Si, or the like, can be used instead of Al.

In the next step (FIG. 2B), the seed layer 14 used as a power feeding layer in a later step in which electrolytic plating is performed is formed on the surface of the semiconductor substrate 11A on the side which the pads 12 and the protection film 13 are formed. For example, the seed layer 14 having a two-layer structure (Ti/Cu) is formed in such a manner that a titanium (Ti) conductive layer (with a thickness of approximately 0.05 μm) is formed by sputtering, and then a copper (Cu) conductive layer (with a thickness of approximately 0.3 μm) is formed on the Ti layer by sputtering.

In the next step (FIG. 2C), a plating resist is formed on the seed layer 14 using a patterning material, and openings are formed at required positions of the plating resist (formation of a resist layer 31 including opening portions OP). The opening portion OP is patterned in accordance with a transverse cross-sectional shape ("circular shape" in this embodiment) of the post 15 to be formed on the pad 12 (seed layer 14).

The posts 15 are formed by copper (Cu) electrolytic plating as described later and are partially subjected to selective etching. To this end, a material having copper etchant resistance is used for a constituent material of the plating resist 31. For example, a photosensitive dry film (one of a structure in which a resist material is held between a polyester cover sheet and a polyethylene separator sheet) can be preferably used. A specific example is described as follows.

First, a surface of the seed layer 14 is cleansed, and a photosensitive dry film is laminated on the surface thereof by thermocompression bonding. Next, this dry film resist is cured by exposure to ultraviolet (UV) irradiation using a mask (not illustrated) patterned into a required shape. Furthermore, corresponding portions of the dry film are subjected to etching using a predetermined developer (e.g., an alkaline-based developer). Thus, the resist layer 31 including the opening portions OP at the required positions is formed.

For example, a dry film resist having a thickness of approximately 50 μm is used and cured by UV exposure under the condition of 300 mJ/cm$^2$. Further, the cured dry film resist is processed for 100 seconds by spraying 1% sodium carbonate aqueous solution thereto. After the development, a baking process is performed for 10 minutes on a hot plate at a temperature of 110° C. Thus, the resist layer 31 including the opening portions OP having a diameter of approximately 40 μm is formed.

A liquid photoresist (a liquid resist such as a novolak-based resin or an epoxy-based resin) can be used as a patterning material instead of the photosensitive dry film. In this case as well, the resist layer 31 including the opening portions OP at the required positions can be formed through steps similar to the aforementioned steps (surface cleansing→resist application on surface→drying→exposure→development).

In the next step (FIG. 2D), the inside of the opening portion OP (FIG. 2C) of the resist layer 31 is first cleaned by being subjected to an oxygen plasma treatment for approximately two minutes as a pre-plating treatment.

Next, the post-shaped conductive layers 15A forming the posts 15 are formed on the seed layer 14 exposed through the opening portions OP, by electrolytic plating using the seed layer 14 as a power feeding layer. In this embodiment, electrolytic plating is performed on the seed layer 14 in a copper sulfate solution, and thus the conductive layers 15A (each having a diameter of approximately 40 μm) made of copper (Cu) and filling the opening portions OP, respectively, are formed.

Figure 2C:
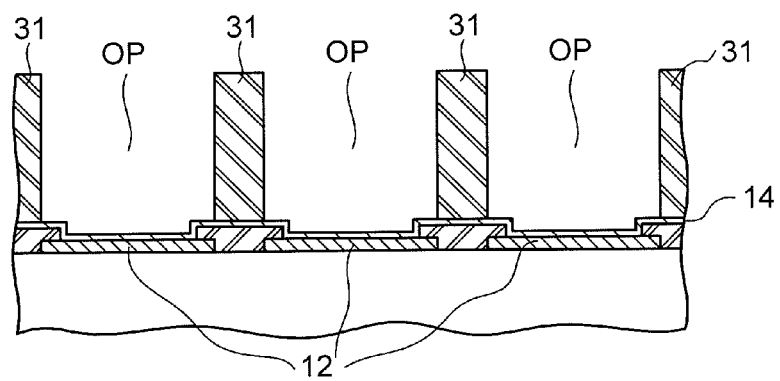
Figure 2D:
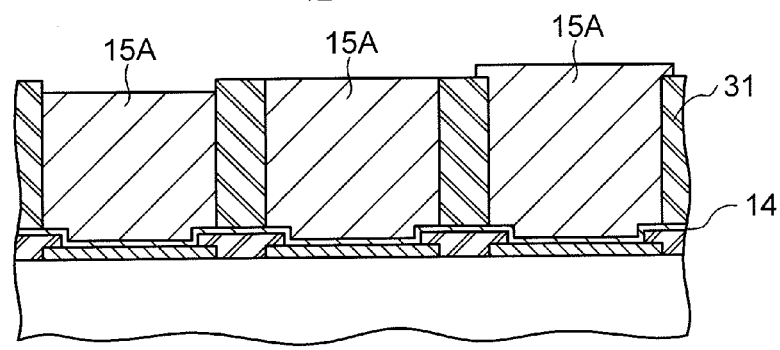

At this stage, the thicknesses of the conductive layers 15A filling the respective opening portions OP are not necessarily equal to each other, and the heights of the conductive layers 15A vary accordingly as illustrated in FIG. 2D.

In the next step (FIG. 2E), the surfaces of the resist layer 31 and conductive layers 15A different in their heights are polished by a physical polishing process (mechanical polishing using buffs including a polishing paper and a polishing material, a brush, or the like, and cutting tool or the like) and is made flat.

Figure 2E:
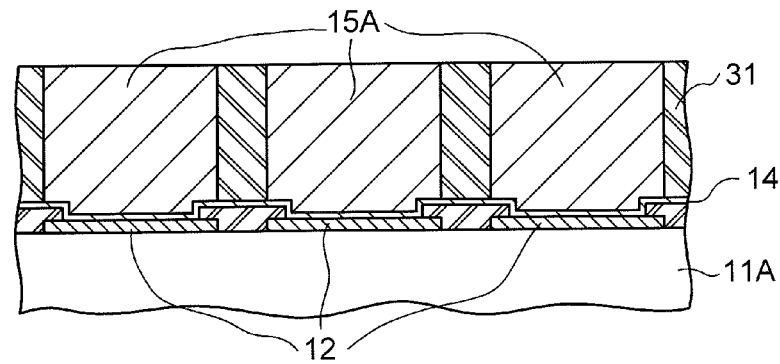

As a result, the structure as illustrated in FIG. 2E is completed in which the post-shaped conductive layers 15A having the same thickness are formed respectively on the pads 12 (seed layer 14) on the substrate (wafer) 11A.

In the next step (FIG. 3A), an etching resist layer 32 is formed using a patterning material, on the entire surface on the side of the structure where the conductive layers 15A are formed. As in the case of the aforementioned plating resist (resist layer 31), a material having copper etchant resistance is used for a constituent material of the resist layer 32. A photosensitive dry film can be preferably used in the same manner as the aforementioned case. For example, a photosensitive dry film having a thickness of approximately 7 μm is laminated on the entire surface by thermocompression bonding so as to form the resist layer 32.

In the next step (FIG. 3B), the etching resist layer 32 is patterned into a required shape so as to form an etching resist (resist layer 32A). Here, the patterning is performed to leave a circular resist portion of the resist layer 32 at the position corresponding to the position of the conductive, layer 15A, the circular resist portion being smaller than the transverse cross-sectional shape (circular shape) of the corresponding conductive layer 15A. Namely, the patterning is performed to expose only a circumferential portion of the top surface of each of the conductive layers 15A.

More specifically, the laminated photosensitive dry film resist (resist layer 32) is cured by exposure to UV irradiation using a mask patterned in a required shape (not illustrated) in the same manner as the processing performed in the step in FIG. 2C. Furthermore, corresponding portions of the photosensitive dry film resist are subjected to etching using a predetermined developer. Thus, the etching resist (resist layer 32A) patterned in the required shape is formed.

For example, UV exposure is performed under the condition of 70 mJ/cm$^2$, and the cured dry film resist is processed for 20 seconds by spraying 1% sodium carbonate aqueous solution. Accordingly, the resist layer 32A is formed in which only the resist portions remain, the resist portions each having a diameter of approximately 30 μm and being left on the conductive layers 15A each having a diameter of approximately 40 μm. Here, the resist layer 32A is formed in such a manner that the centers of the circular resist portions substantially coincide with the center axes of the conductive layers 15A, respectively.

As in the case of the aforementioned plating resist (resist layer 31), a liquid photoresist can be used instead of the photosensitive dry film. In this case as well, the resist layer 32A in which only the circular resist portions remain at the predetermined positions are formed through steps similar to the aforementioned steps (surface cleansing→resist application on surface→drying→exposure→development).

In the next step (FIG. 3C), the exposed portions of the post-shaped conductive layers 15A (FIG. 3B) (circumferential portions of the top surfaces of the conductive layers 15A) are selectively removed using the etching resist (resist layer 32A) as a mask. To be more specific, the exposed portions of the conductive layers 15A are selectively etched away by wet etching using a cupric chloride aqueous solution, a ferric chloride aqueous solution, an ammonium persulfate aqueous solution or the like. For example, a spray process using a cupric chloride aqueous solution is performed for 60 seconds.

Figure 3A:
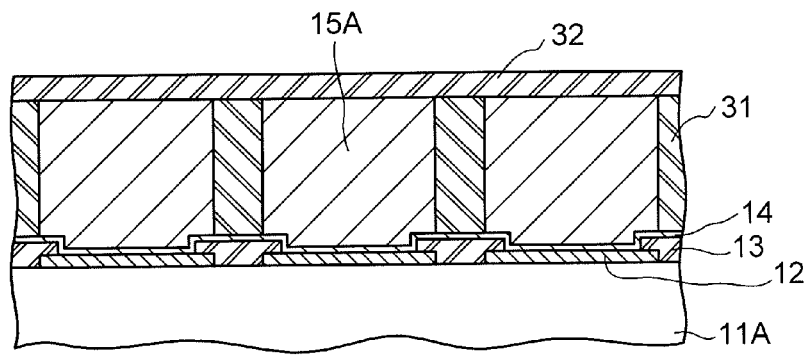
FIGS. 3A to 3D are cross-sectional views illustrating manufacturing steps subsequent to the steps in FIGS. 2A to 2E.
Figure 3B:
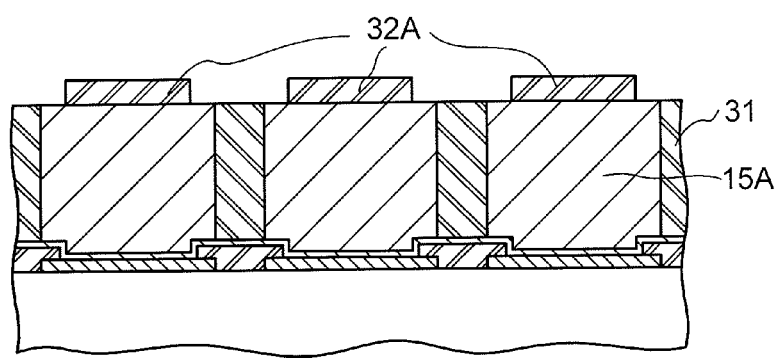
Figure 3C:
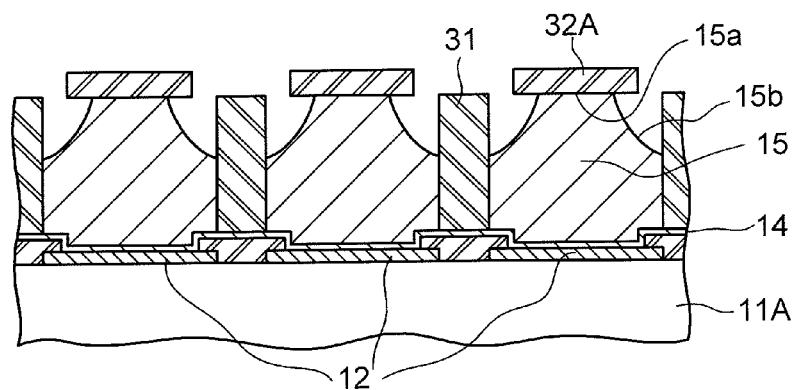

Accordingly, the etchant penetrates to the inside of the conductive layers 15A from the circumferential portions of the top surfaces thereof. Thus, the circumferential portions and the side surfaces near the circumferential portions of the conductive layers 15A are removed so as to leave tapered forms. As a result, Cu posts 15 as illustrated in FIG. 3C are formed. Namely, the Cu post 15 is formed in such a manner that the transverse cross-sectional area thereof gradually becomes smaller (decreases) toward the leading end 15a from a midway position in the height direction.

Furthermore, a surface treatment (electrolytic plating) can be performed as appropriate on the side surface 15b of each of the Cu posts 15 which is shaped in a tapered form. Such a surface treatment is performed to increase the solder wettability (soldering properties) because the solder used in flip-chip mounting is attached to the side surfaces 15b. An embodiment in which the surface treatment (electrolytic plating) is performed is described later in detail.

In the final step (FIG. 3D), the plating resist/etching resist (resist layers 31 and 32A in FIG. 3C) are first removed. In the case where a dry film is used as the material of each of the resist layers 31 and 32A, an alkaline chemical liquid such as a sodium hydroxide or monoethanolamine-based solution can be used for removal. For example, in the case where a liquid resist such as a novolak-based resin is used, immersion in an N-methylpyrrolidone solution is performed for 10 minutes for removal.

As a result, the Cu posts 15 and the seed layer 14 are partially exposed (see FIG. 3C). Here, the pads 12 (Cu posts 15) still remain in the state of being electrically connected to each other via the seed layer 14 as illustrated in FIG. 3C.

Next, portions of the seed layer (Ti/Cu) 14 which are exposed from the base portions of the posts are removed. To be more specific, wet etching using a chemical liquid to which Cu is soluble is performed first, and wet etching using a chemical liquid to which Ti is soluble is performed next. Thus, the portions of the seed layer 14 which are exposed from the base portions of the posts 15 can be etched away. For example, immersion in a sulfuric acid/hydrogen peroxide-based solution is performed for 30 seconds at a temperature of 30° C. (removal of the Cu layer), and subsequently, immersion in a hydrogen peroxide-based solution is performed for one minute at a temperature of 40° C. (removal of the Ti layer).

As a result, the protection film 13 immediately below the removed seed layer 14 is exposed (FIG. 3D), and the pads 12 (Cu posts 15) are in the state of being insulated from each other.

Note that, when the Cu layer portions of the seed layer 14 are etched away, the surfaces of the Cu posts 15 are simultaneously etched away by the same amount. However, since the film thickness (height) of the posts 15 is much larger than the seed layer 14, the characteristic shape of the posts 15 are not impaired even if the surfaces thereof are slightly removed. To put it differently, the shape of each of the Cu posts 15 is surely kept, in which the transverse cross-sectional area (circular shape) of the Cu post 15 decreases toward the leading end 15a from a certain position in the height direction thereof. Thus, there is no problem at all.

Figure 3D:
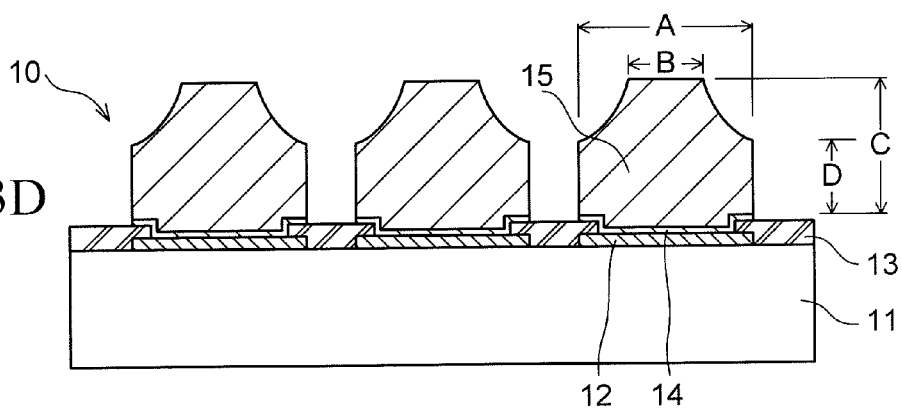

Furthermore, after the back surface of the substrate (wafer) 11A is polished as appropriate to reduce the thickness thereof to a required thickness, the substrate 11A is diced into individual device units. Accordingly, as illustrated in FIG. 3D, the chip (semiconductor element 10) can be obtained in which the plurality of Cu posts 15 are vertically provided on the surface of the substrate 11 on the side which the protection film 13 is formed.

In this semiconductor element (chip) 10, examples of the sizes of portions A to D of the Cu post 15 are as follows. To begin with, the diameter A of the base portion (portion on the side connected to the pad 12) of the Cu post 15 is selected to be between 20 μm and 100 μm (preferably, 40 μm), while the diameter B, which is the smallest diameter of the leading end portion on the side opposite to the base portion (portion on the side facing the wiring board 20 at the time of mounting), is selected to be between 10 μm to (diameter A—10 μm) (preferably, 10 μm). In addition, the height C of the Cu post 15 is selected to be between 20 μm and 100 μm (preferably, 40 μm), while the height D of the post-shaped portion (portion excluding the portion of the side surface 15b shaped in a tapered form) is selected to be between 5 μm to (height C—5 μm) (preferably, 15 μm).

As described above, with the semiconductor element 10 and the method of manufacturing the same (FIGS. 2A to 2E and FIGS. 3A to 3D) according to the first embodiment, the side surface 15b in the portion near the leading end 15a of each of the Cu posts 15 is shaped in a tapered form. Thus, even if the solder 25 used in mounting the semiconductor element 10 on the wiring board 20 crawls up on the side surface, most of the solder is held by the side surface 15b shaped in a tapered form (see FIG. 1A). Thus, there is no substantial influence on a side surface portion beyond the side surface 15b (the portion near the base portion of the Cu post 15). Even if the solder crawls up to the side surface portion, the amount of solder is small. Accordingly, a short circuit between the posts adjacent to each other as observed in the state of the art (FIG. 1B) can be solved.

In addition, in the case of the columnar posts 16 of the state of the art (FIG. 1B), where the amount of the solders 25 and 26 attached to the pads 22 on the wiring board 20 is small, the solder 26 is expected not to crawl up on the side surfaces 16b of the posts 16. Meanwhile, in the case of the shape of the post-shaped terminals (Cu posts) 15 of this embodiment, the solder 25 can sufficiently crawl from the leading ends 15a of the Cu posts 15 to the side surfaces 15b each shaped in a tapered form. For this reason, the surface area of a portion on each of the Cu posts 15 in contact with the solder 25 corresponds to the surface areas of the leading end 15a of the post and of the side surface 15b on which the solder 25 crawls up. Accordingly, the surface area of the portion in contact with the solder is increased compared to that of the columnar post 16 of the state of the art (which is equal to the surface area of the leading end 16a or less). Thus, the connection reliability at the time of mounting is improved, and the occurrence of an open failure can be removed.

As described above, even in the case where the pitch between the pads 12 (corresponding to the positions of the posts 15) is reduced (a pitch equal to or less than 40 μm, for example), the semiconductor element 10 according to the first embodiment can be mounted on the wiring board 20 without causing a short circuit or an open failure.

Moreover, with the method of manufacturing the semiconductor element (chip) 10 according to the first embodiment, the Cu posts 15 formed respectively on the pads 12 (on the seed layer 14) of the semiconductor substrate 11 are collectively formed using a lithography technique. For this reason, the method is advantageous particularly in the case where the number of pins per chip is increased to, for example, 300 pins or more.

(Second Embodiment See FIGS. 4A to 4E)

In the aforementioned first embodiment, descriptions are given of the example in which, in the formation of the Cu posts 15 (FIG. 3C), an organic material (such as a photosensitive dry film) is used as an etching-resistant material forming the resist layer 32A used to selectively etch the circumferential portions of the top surfaces of the conductive layers 15A. However, the material of the etching resist is not limited to the organic material as a matter of course. In the following second embodiment, a metal material is used as the etching-resistant material.

Hereinafter, a description is given of a process (method of manufacturing a semiconductor element) according to the second embodiment with reference to FIGS. 4A to 4E, which illustrate part of the entire manufacturing steps.

To begin with, the same processing as the processing performed in the steps in FIGS. 2A to 2E is performed to fabricate a structure in which the post-shaped conductive layers 15A having the same thickness are formed respectively on the pads 12 (seed layer 14) on the substrate (wafer) 11A.

In the next step (FIG. 4A), a lift-off resist layer 33 is formed using a patterning material, on the surface of the structure on the side which the conductive layers 15A are formed. The resist layer 33 is patterned to include opening portions OP1 each having a circular shape smaller than the transverse cross-sectional area (circular shape) of a corresponding one of the conductive layers 15A at the position corresponding to the position of the conductive layer 15A. During this step, the patterning is performed in such a way that the vertical cross-section of the opening portion OP1 is formed into a "trapezoidal shape" (shape in which the opening area gradually becomes wider from the upper side toward the lower side).

In order to form the resist layer 33 having the opening portions OP1 each formed in the trapezoidal shape as described above, it is preferable to use a liquid photoresist (liquid photoresist such as a novolak-based resin) as the patterning material. Basically, the required resist layer 33 can be formed through the steps of surface cleansing→resist application→drying→exposure→development.

For example, a liquid resist is applied by spin coating to a thickness of approximately 5 μm and exposed to UV under the condition of 180 mJ/cm².

Figure 4A:
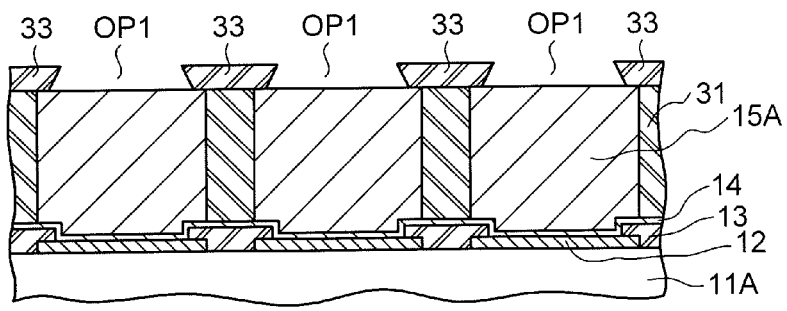
FIGS. 4A to 4E are cross-sectional views illustrating manufacturing steps (part of the entire manufacturing steps) of a semiconductor element (chip) according to a second embodiment.
Figure 4B:
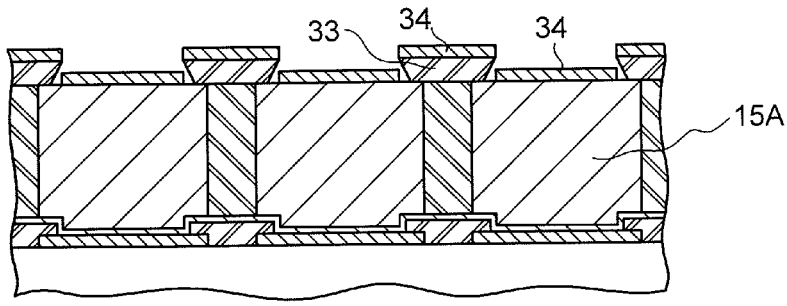

Thereafter, the cured resist is subjected to immersion in a 2.38% TMAH (tetramethylammonium hydroxide) aqueous solution for 120 seconds. After the development, a baking process is performed for 90 seconds on a hot plate at a temperature of 110° C. Thus, the lift-off resist layer 33 including the opening portions OP1 respectively at predetermined positions are formed, each of the opening portions OP1 having the vertical cross-section thereof formed into the trapezoidal shape as illustrated in FIG. 4A.

In the next step (FIG. 4B), metal layers 34 having copper etchant resistance are formed on the surface of the structure on the side which the resist layer 33 is formed. For example, metal layers made of titanium (Ti) are formed to a thickness of approximately 0.3 μm by sputtering. Thus, the metal (Ti) layers 34 are formed respectively on portions of the resist layer 33 and the conductive layers 15A.

In the next step (FIG. 4C), the lift-off resist layer 33 is removed together with the metal (Ti) layer 34 formed on the surface thereof. For example, immersion in an N-methylpyrrolidone solution is performed for three minutes at a temperature of 50° C. for removal.

Figure 4C:
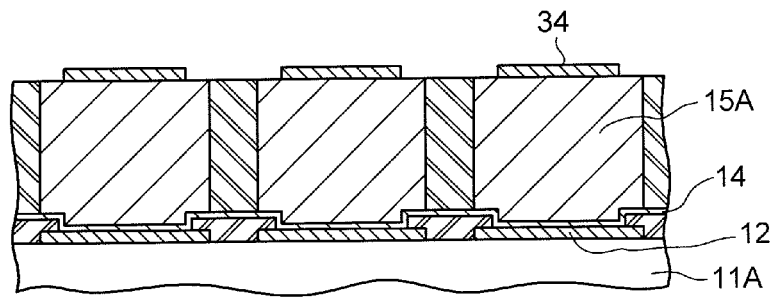

As a result, the structure is completed in which the circular metal (Ti) layers 34 having only the circumferential portions of the top surfaces of the conductive layers 15A exposed are formed on the post-shaped conductive layers 15A formed on the pads 12 (seed layer 14), respectively, on the substrate 11A as illustrated in FIG. 4C.

In the next step (FIG. 4D), the exposed portions (the circumferential portions of the top surfaces of the conductive layers 15A) of the conductive layers 15A (see FIG. 4C) are selectively removed using the metal (Ti) layers 34 as a mask. For example, a spray process using a cupric chloride aqueous solution is performed for 60 seconds for the selective etching in the same manner as the processing performed in the step in FIG. 3C.

Figure 4D:
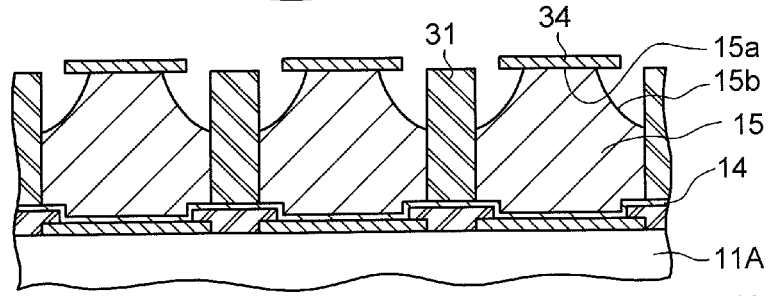

Accordingly, the circumferential portions of the top surfaces of the conductive layers 15A and the side surfaces near the circumferential portions are removed to leave tapered forms. As a result, the Cu posts 15 as illustrated in FIG. 4D are formed.

In the final step (FIG. 4E), the metal layers (Ti) used as the etching resist are first removed. For example, immersion in a hydrogen peroxide-based solution is performed for two minutes at a temperature of 50° C. for removal. Thus, the leading end 15a of each of the Cu posts 15 is exposed together with the side surface 15b shaped in a tapered form.

At this stage, a surface treatment (electrolytic plating) can be performed as appropriate on the exposed side surfaces 15b and surfaces of the leading ends 15a of the Cu posts 15. Such a treatment is performed to increase the solder wettability because the solder used in flip-chip mounting is attached to the leading ends 15a and the side surfaces 15b. An embodiment in which the surface treatment (electrolytic plating) is performed is described later in detail.

Next, the plating resist (resist layer 31 in FIG. 4D) is removed in the same manner as the processing performed in the step in FIG. 3D. For example, immersion in a monoethanolamine-based solution is performed for 10 minutes. Subsequently, the portions of the seed layer (Ti/Cu) 14 which are exposed from the base portions of the posts 15 are removed. For example, immersion in a sulfuric acid/hydrogen peroxide-based solution is performed for 30 seconds at a temperature of 30° C. (removal of the Cu layer), and then, immersion in a hydrogen peroxide-based solution is performed for one minute at a temperature of 40° C. (removal of the Ti layer).

Figure 4E:
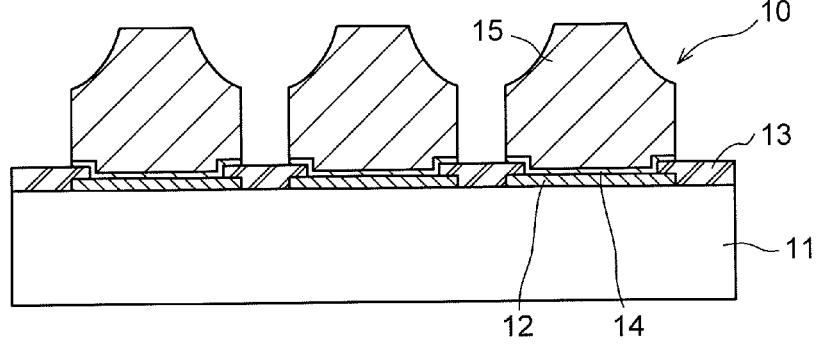

Furthermore, after the back surface of the semiconductor substrate 11A is polished as appropriate, the substrate 11A is diced into individual device units. As a result, as illustrated in FIG. 4E, the chip (semiconductor element 10) can be obtained in which the plurality of Cu posts 15 are vertically provided on the surface of the substrate 11 on the side which the protection film 13 is formed.

In this second embodiment as well, the advantages (the semiconductor element can be mounted on a wiring board or the like without causing a short circuit or the like even if the pitch is narrow) based on the specific shape of the Cu post 15 can be obtained as in the case of the aforementioned first embodiment.

(Third Embodiment See FIGS. 5A to 5E)

In each of the aforementioned first and second embodiment, descriptions are given of the example in which the etching resist (resist layer 32A or metal layers 34) patterned to expose only the circumferential portions of the top surfaces of the conductive layers 15A is used to shape the leading end portion of each of the posts 15 in a tapered form (see FIG. 3C and FIG. 4D). However, means for shaping each of the leading end portions of the Cu posts 15 in a tapered form is not limited to this as a matter of course. In the following third embodiment, in order to shape each of the leading end portions of the Cu posts 15 in a tapered form, the thickness of the resist layer 31 around the conductive layers 15A is reduced so that the side surface portions near the top surfaces of the conductive layers 15A are exposed and the exposed portions are selectively etched away.

Hereinafter, a description is given of a process (method of manufacturing a semiconductor element) according to the third embodiment with reference to FIGS. 5A to 5E, which illustrate part of the entire manufacturing steps.

To begin with, the same processing as the processing performed in the steps in FIGS. 2A to 2E is performed to fabricate a structure in which the post-shaped conductive layers 15A having the same thickness are formed respectively on the pads 12 (seed layer 14) on the substrate (wafer) 11A.

Next (FIG. 5A), a metal layer 35 having copper etchant resistance is formed on the surface of the structure on the side which the conductive layers 15A are formed. For example, a metal layer made of titanium (Ti) is formed to a thickness of approximately 0.3 µm by sputtering. Thus, the metal layer 35 is formed on the entire surface (on the conductive layers 15A and the resist layer 31). The bonding strength of the portions of the metal (Ti) layer 35 which are formed respectively on the conductive layers 15A is high because the adhesion between the portions of the metal layer 35 and Cu forming the conductive layers 15A is good.

In the next step (FIG. 5B), only the metal (Ti) layer 35 formed on the resist layer 31 is selectively removed by performing blast processing such as sand blasting on the metal (Ti) layer 35 formed on the entire surface. During the removal, the portions of the metal (Ti) layer 35 on the conductive layers 15A are not removed by the blast processing because the bonding strength thereof with the conductive (Cu) layers 15A is high. As a result, the structure in which metal (Ti) layers 35A are formed only on the conductive layers 15A is completed.

In the next step (FIG. 5C), a process to slightly reduce the thickness of the resist layer 31 is performed on the resist layer 31 exposed in the structure (formation of resist layer 31A). For example, the upper layer portion of the resist layer 31 is etched for approximately 10 µm by plasma processing (reactive gas: oxygen gas, supply power: 500 w, processing time: five minutes). The side surface portions near the top surfaces of the conductive layers 15A are exposed by the etching.

In the next step (FIG. 5D), the exposed portions of the conductive layers 15A (the side surface portions near the top surfaces of the conductive layers 15A) are selectively removed using the metal (Ti) layers 35A on the conductive layers 15A as a mask. For example, a spray process using a cupric chloride aqueous solution is performed for 40 seconds for the selective etching in the same manner as the processing performed in the step in FIG. 4D.

Figure 5A:
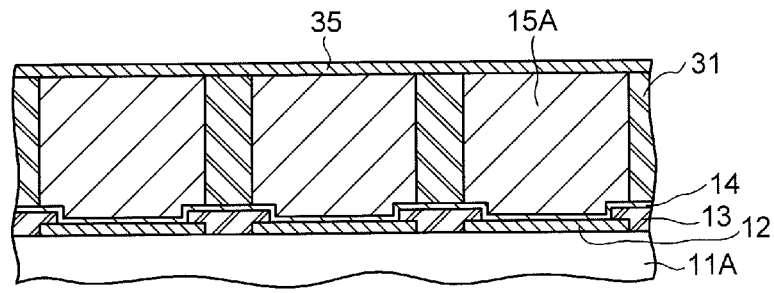
FIGS. 5A to 5E are cross-sectional views illustrating manufacturing steps (part of the entire manufacturing steps) of a semiconductor element (chip) according to a third embodiment.
Figure 5B:
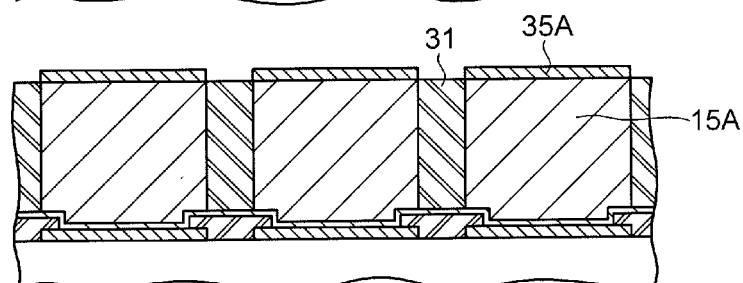

Thus, the circumferential portions of the top surfaces of the conductive layers 15A and the side surfaces near the circumferential portions are removed to leave tapered forms. As a result, the Cu posts 15 as illustrated in FIG. 5D are formed.

Note that, the etching time (40 seconds, for example) required in this step is short as compared with the etching time (60 seconds, for example) required in the step in FIG. 4D. This is because the etchant penetrates inward from the side surface portions near the top surfaces of the conductive layers 15A in this example while the etchant penetrates downward from the circumferential portions of the top surfaces of the conductive layers 15A in the aforementioned example. Accordingly, the processing time for etching can be shortened as compared with the cases of the first and second embodiments. In addition, the height (corresponding to the dimension (C-D) in FIG. 3D) of the portions of the side surfaces 15b each shaped in a tapered form can be made large more easily.

In the final step (FIG. 5E), in the same manner as the processing performed in the step in FIG. 4E, the metal layers 35A (Ti) used as the etching resist are first removed, and the plating resist (resist layer 31A in FIG. 5D) is then removed.

Furthermore, the portions of the seed layer (Ti/Cu) 14 which are exposed from the base portions of the posts are removed. Then, after the back surface of the substrate 11A is polished as appropriate, the substrate 11A is diced into individual device units. As a result, as illustrated in FIG. 5E, the chip (semiconductor element 10) can be obtained in which the plurality of Cu posts 15 are vertically provided on the surface of the substrate 11 on the side which the protection film 13 is formed.

Note that, the processing time required for removal of the plating resist (resist layer 31A) in this step is short (for example, five minutes) as compared with the processing time required for removal of the plating resist (resist layer 31) in the step in FIG. 4E (for example, ten minutes). This is because the thickness of the resist layer 31A is reduced in this embodiment, so that the amount (volume) of the resist layer 31A to be removed is small as compared with the case of the aforementioned resist layer 31. Accordingly, the processing time required for removal of the plating resist can be shortened as compared with the cases of the first and second embodiments.

According to the third embodiment, in addition to the advantages obtained in the aforementioned first and second embodiments, there is a further advantage in that the processing time for etching (FIG. 5D) and the processing time required for removal of the plating resist (FIG. 5E) can be shortened. Moreover, there is another advantage in that the height (corresponding to the dimension (C-D) in FIG. 3D) of the portions of the side surfaces 15b each shaped in a tapered form can be made large more easily. Such advantages contribute to an improvement in the production yield and production efficiency.

(Fourth Embodiment See FIGS. 6A to 6D)

Hereinafter, a description is given of a process (method of manufacturing a semiconductor element) according to a fourth embodiment with reference to FIGS. 6A to 6D, which illustrate part of the entire manufacturing steps.

To begin with, the same processing as the processing performed in the steps in FIGS. 2A to 2E is performed to fabricate a structure in which the post-shaped conductive layers 15A having the same thickness are formed respectively on the pads 12 (seed layer 14) on the substrate (wafer) 11A.

Next (FIG. 6A), metal layers 36 having copper etchant resistance are formed on the conductive layers 15A of the structure by electrolytic plating using the conductive layers 15A as a power feeding layer. For example, the metal layer 36 made of nickel (Ni) is formed to a thickness of approximately 1 µm by performing electrolytic plating on the conductive layers 15A (Cu) in a nickel sulfamate solution. Thus, a structure in which the resist layer 31 is exposed from the metal layers 36 is completed.

Figure 5C:
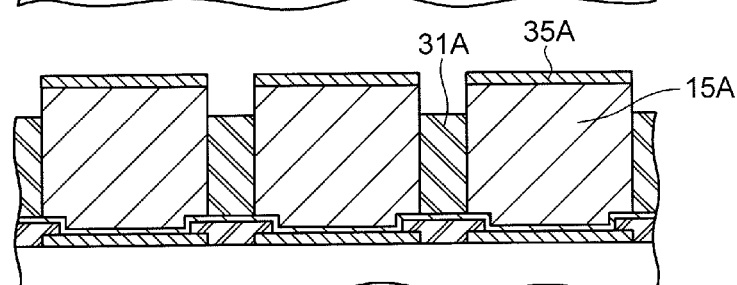
Figure 5D:
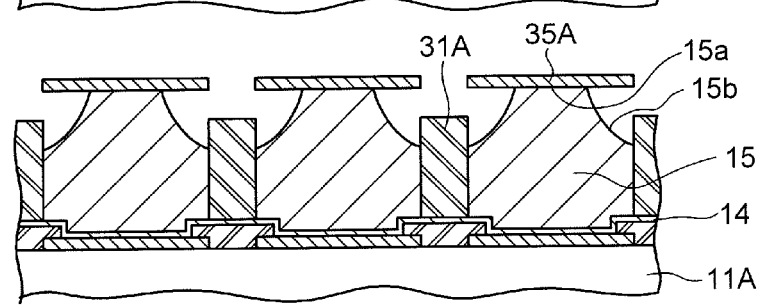
Figure 5E:
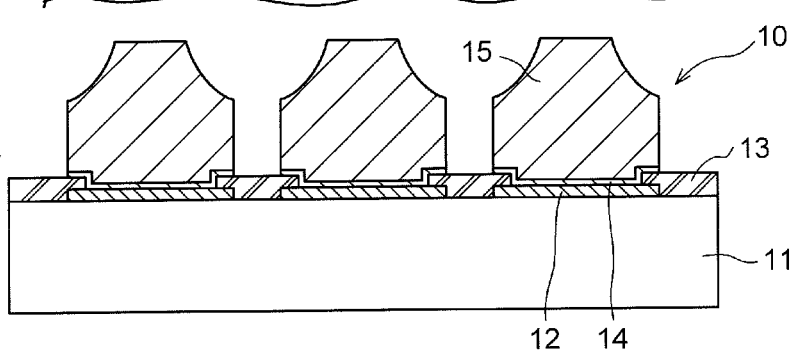

In the next step (FIG. 6B), in the same manner as the processing performed in the step in FIG. 5C, the upper layer portion of the resist layer 31 is etched for approximately 10 µm by performing a plasma treatment (reactive gas: oxygen gas, supply power: 500 w, processing time: five minutes) on the exposed resist layer 31 (formation of the resist layer 31A).

The side surface portions near the top surfaces of the conductive layers 15A are exposed by the etching.

In the next step (FIG. 6C), in the same manner as the processing performed in the step in FIG. 5D, the exposed portions of the conductive layers 15A (the side surface portions near the top surfaces of the conductive layers 15A) are selectively removed by wet etching using the metal (Ni) layer 36 on the conductive layers 15A as a mask.

As a result, the circumferential portions of the top surfaces of the conductive layers 15A and the side surfaces near the circumferential portions are removed so as to leave tapered forms. Thus the Cu posts 15 as illustrated in FIG. 6C are formed.

In the final step (FIG. 6D), the metal layers 36 (Ni) used as the etching resist are first removed. Then, in the same manner as the processing performed in the step in FIG. 5E, the plating resist (resist layer 31A in FIG. 6C) is removed. Furthermore, the portions of the seed layer (Ti/Cu) 14 which are exposed from the base portions of the posts 15 are removed. Then, after the back surface of the substrate 11A is polished as appropriate, the substrate 11A is diced into individual device units. As a result, as illustrated in FIG. 6D, the chip (semiconductor element 10) can be obtained in which the plurality of Cu posts 15 are vertically provided on the surface of the substrate 11 on the side which the protection film 13 is formed.

Figure 6A:
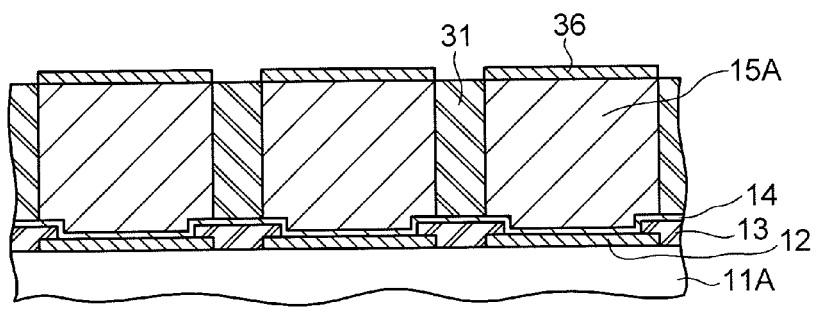
FIGS. 6A to 6D are cross-sectional views illustrating manufacturing steps (part of the entire manufacturing steps) of a semiconductor element (chip) according to a fourth embodiment.
Figure 6B:
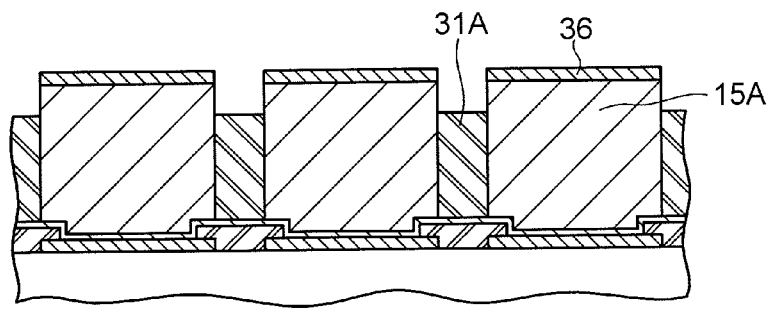
Figure 6C:
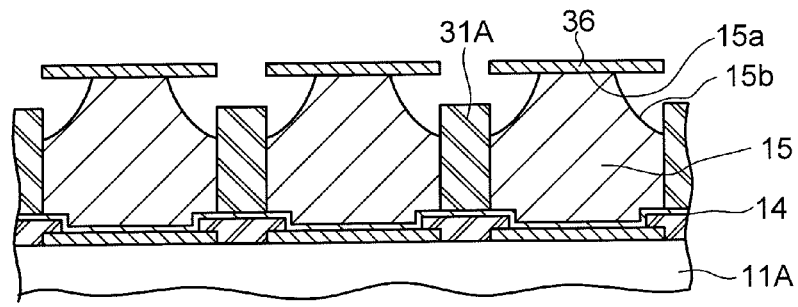
Figure 6D:
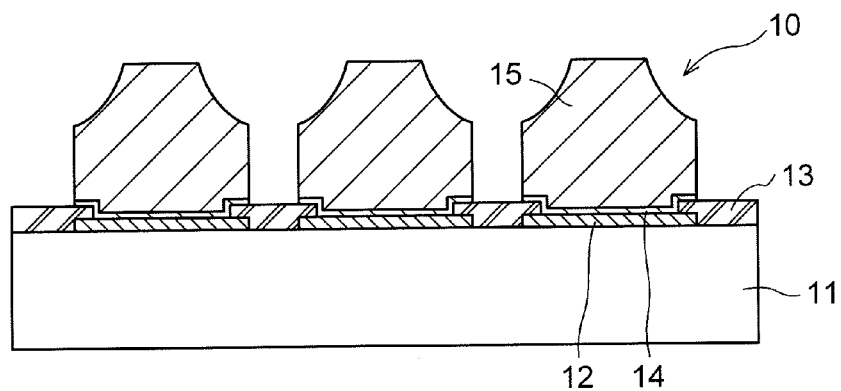

The fourth embodiment is different from the aforementioned third embodiment only in that the steps in FIGS. 5A and 5B in the third embodiment are replaced with the step in FIG. 6A. Accordingly, the same advantages as those obtained in the third embodiment can be basically obtained.

Note, there is a further advantage in that the manufacturing steps as a whole can be simplified since the number of steps in the fourth embodiment is less by one. Such an advantage contributes to an improvement in the production yield and production efficiency.

Figure 7A:
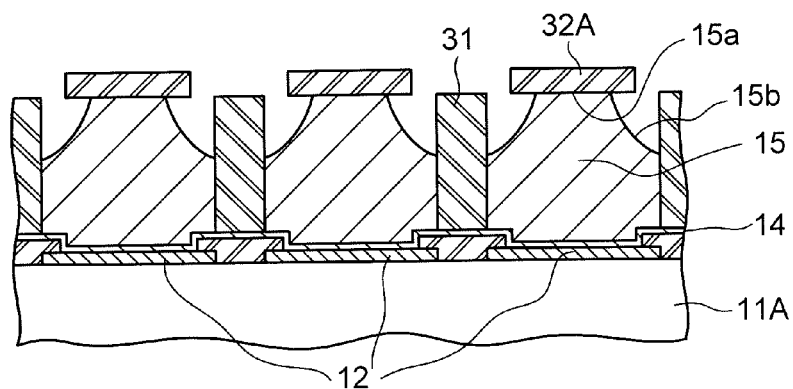
FIGS. 7A to 7C are cross-sectional views illustrating steps according to an embodiment in which a surface treatment is applied to Cu posts.

(Other Embodiments See FIG. 7A to FIG.D)

Figure 7B:
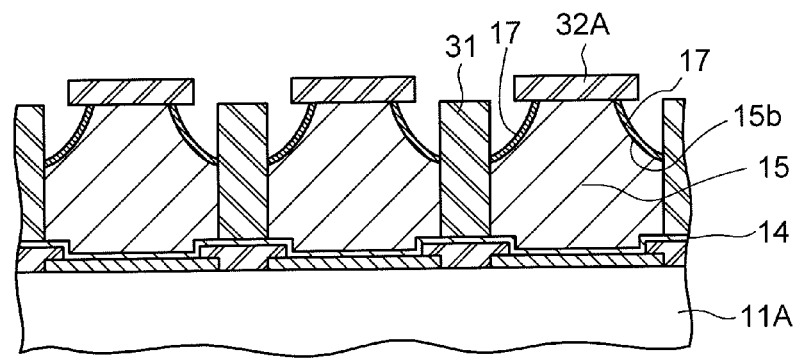
Figure 7C:
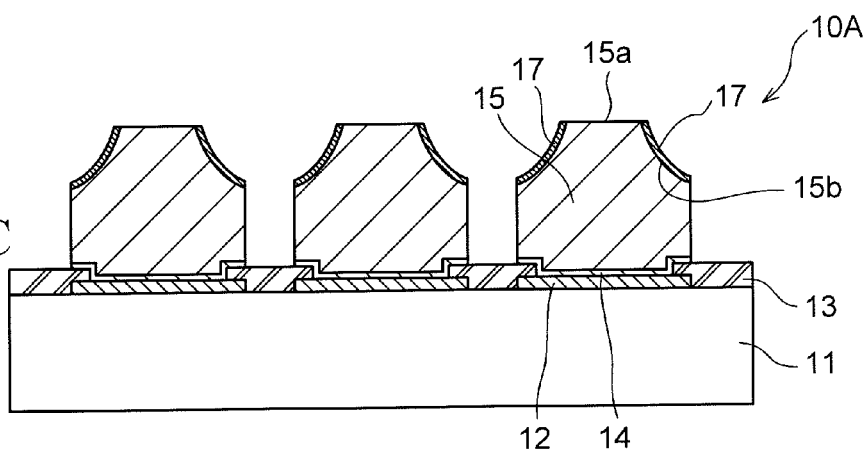

FIGS. 7A to 7C illustrate in cross-sectional views, the steps according to an embodiment in which a surface treatment is applied to the Cu posts 15. The surface treatment performed in this embodiment can be applied to the first embodiment (FIGS. 3A to 3D)

First, in the initial step (FIG. 7A), the structure fabricated in the step in FIG. 3C (structure in which the circumferential portions of the top surfaces of the conductive layers 15A and the side surfaces near the circumferential portions are removed so as to leave tapered forms, and the Cu posts 15 are thus formed) is prepared.

In the next step (FIG. 7B), a metal layer (plating layer) 17 is formed on an exposed portion of each of the Cu posts 15 (side surface 15b shaped in a tapered form) by electrolytic plating using the seed layer 14 as a power feeding layer.

Configuration examples of the plating layer 17 to be formed include: a single layer structure in which Sn plating (thickness of 1 μm to 10 μm), Au plating (thickness of 0.05 μm to 0.5 μm) or Ag plating (thickness of 0.05 μm to 0.5 μm) is applied; a two-layer structure in which Ni plating (thickness of 1 μm to 10 μm) and Au plating (thickness of 0.05 μm to 0.5 μm) are applied in this order; and a two-layer structure in which Pd plating (thickness of 0.01 μm to 0.1 μm) and Au plating (thickness of 0.01 μm to 0.1 μm) are applied in this order. Moreover, the plating layer 17 can have a three layer structure in which Ni plating (thickness of 0.5 μm to 10 μm), Pd plating (thickness of 0.01 μm to 0.5 μm), and Au plating (thickness of 0.001 μm to 0.5 μm) are applied in this order.

In the final step (FIG. 7C), in the same manner as the processing performed in the step in FIG. 3D, the plating resist and the etching resist (resist layers 31 and 32A) are first removed. Thereafter, the portions of the seed layer (Ti/Cu) 14 which are exposed from the base portions of the posts 15 are removed. Then, after the back surface of the substrate 11A is polished as appropriate, the substrate 11A is diced into individual device units. As a result, as illustrated in FIG. 7C, the chip (semiconductor element 10A) can be obtained in which the plurality of Cu posts 15 (one in which the leading ends 15a are exposed while the plating layers 17 are formed on the side surfaces 15b shaped in tapered forms) are vertically provided on the surface of the substrate 11 on the side which the protection film 13 is formed.

With the semiconductor element 10A according to the embodiment illustrated in FIGS. 7A to 7C, in addition to the advantages obtained in the aforementioned first embodiment, it is possible to further obtain an advantage in that the wettability of solder used in flip-chip mounting can be increased because of the presence of the plating layers 17 formed on the side surfaces 15b each having a tapered form. Such configuration contributes to an improvement in the production yield in flip-chip mounting.

Moreover, the side surface of the base portion of each of the posts 15 (side surface of the portion where the transverse cross-sectional area does not change) has a structure in which the base material (copper) of the post 15 is exposed. For this reason, at the time of flip-chip mounting, the solder 25 (see FIG. 1A) is unlikely to crawl up onto the side surface on the base portion of the post 15 because of a difference in solder wettability between the plating layer 17 formed on the side surface 15b in a tapered form and the side surface of the base portion (the base material of the post). As a result, it is possible to suppress the excessive crawling of solder and also to prevent a short circuit due to a solder bridge formed between the adjacent posts.

FIGS. 8A to 8D illustrate in cross-sectional views, the steps according to another embodiment in which a surface treatment is performed on the Cu posts 15. The surface treatment performed in this embodiment can be basically applied to both of the first and second embodiments (FIGS. 3A to 3D and FIGS. 4A to 4E). Here, a description is given of an example in which the surface treatment is applied to the second embodiment.

First, in the initial step (FIG. 8A), the structure fabricated in the step in FIG. 4D (structure in which the circumferential portions of the top surfaces of the conductive layers 15A and the side surfaces near the circumferential portions are removed to leave tapered forms, and the Cu posts 15 are thus formed) is prepared.

In the next step (FIG. 8B), the portions of the mask which cover the leading ends 15a of the Cu posts 15 (metal (Ti) layer 34) are removed. For example, wet etching processing or the like can be performed for removal. As a result, the leading ends 15a of the Cu posts 15 are exposed together with the side surfaces 15b each shaped in a tapered form.

In the next step (FIG. 8C), a metal layer (plating layer) 18 is formed on the exposed portion of each of the Cu posts 15 (the side surfaces 15a each shaped in a tapered form and the surfaces of the leading ends 15a) by electrolytic plating using the seed layer 14 as a power feeding layer. The configuration examples of the plating layer 18 to be formed are the same as those of the plating layer 17 formed in the step in FIG. 7B.

In the final step (FIG. 8D), in the same manner as the processing performed in the step in FIG. 4E, the plating resist (resist layer 31) is first removed. Thereafter, the portions of the seed layer (Ti/Cu) 14 which are exposed from the base portions of the posts 15 are removed. Then, after the back surface of the substrate 11A is polished as appropriate, the substrate 11A is diced into individual device units. As a result, as illustrated in FIG. 8D, the chip (semiconductor element 10B) can be obtained in which the plurality of Cu posts 15 (one in which the plating layers 18 are formed on the side surfaces 15b shaped in tapered forms and on the surfaces of the leading ends 15a) are vertically provided on the surface of the substrate 11 on the side which the protection film 13 is formed.

With the semiconductor element 10B according to the embodiment illustrated in FIGS. 8A to 8D, the plating layers 18 (metal layers for improving the solder wettability) are formed respectively on the surfaces of the leading ends 15a in addition to the side surfaces 15b each shaped in a tapered form on the Cu posts 15 as compared with the semiconductor element 10A illustrated in FIGS. 7A to 7C. Such configuration contributes to an improvement in the production yield in flip-chip mounting.

Moreover, as similar to the semiconductor element 10A illustrated in FIGS. 7A to 7C, the side surface of the base portion of each of the posts 15 (side surface of the portion where the transverse cross-sectional area does not change) has a structure in which the base material (copper) of the post 15 is exposed. For this reason, at the time of flip-chip mounting, crawling-up of solder is suppressed so as not to reach the side surface on the base portion of the post 15. As a result, it is possible to prevent a short circuit due to a solder bridge formed between the posts adjacent to each other.

Note that, the steps of the surface treatment illustrated in FIGS. 8A to 8D can be applied to the first embodiment (FIGS. 3A to 3D). The processing in this case is as follows.

First, the structure fabricated in the step in FIG. 3C (structure in which the circumferential portions of the top surfaces of the conductive layers 15A and the side surfaces near the circumferential portions are removed so as to leave tapered forms, and the Cu posts 15 are thus formed) is prepared. Next, the portions (resist layer 32A) of the mask which cover the leading ends 15a of the Cu posts 15 are removed.

In the removal, only the resist layer 32A is selectively removed because the resist layer 31 (plating resist) covering the side surfaces of the Cu posts 15 needs to be left for plating to be performed later. For example, plasma processing, blast processing, a physical polishing process such as mechanical polishing, or the like can be used for removal. The removal of the resist layer 32A exposes the leading ends 15a of the Cu posts 15 together with the side surfaces 15b each shaped in a tapered form. The processing to be performed thereafter is the same as the processing performed in the steps in FIG. 8C and thereafter.

Note that, in the case where plasma processing or blast processing is performed to remove the resist layer 32A, the height of the resist layer 31 becomes low because the top surface of the resist layer 31 which covers the side surfaces of the posts is also removed. Namely, the position of the top surface of the resist layer 31 becomes lower than the leading ends 15a of the Cu posts 15.

Figure 9A:
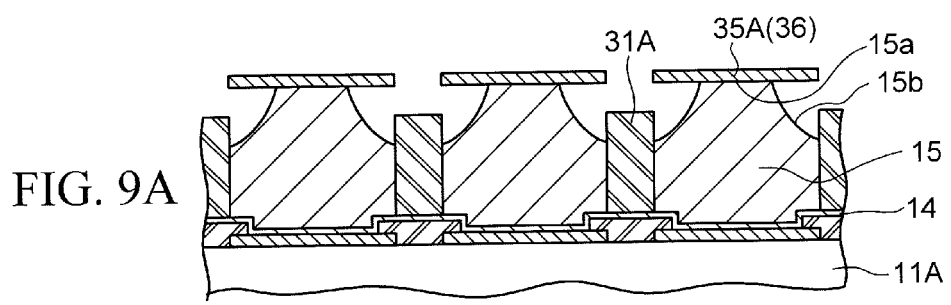
FIGS. 9A to 9D are cross-sectional views illustrating steps according to still another embodiment in which a surface treatment is applied to Cu posts.
Figure 9B:
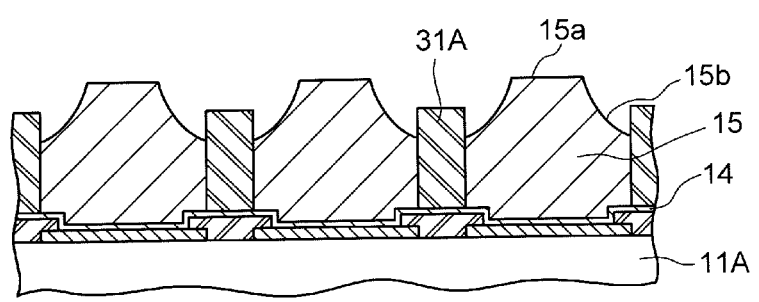
Figure 9C:
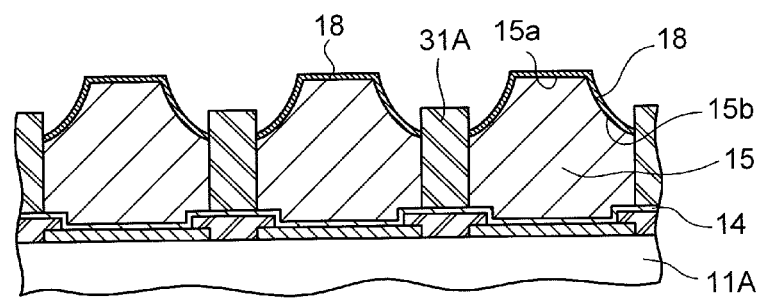

FIGS. 9A to 9C illustrate in cross-sectional views, the steps according to still another embodiment in which a surface treatment is applied to the Cu posts 15. The surface treatment to be performed in this embodiment can be applied to the third and fourth embodiments (FIGS. 5A to 5E and FIGS. 6A to 6D).

First (FIG. 9A), the structure fabricated in the step in FIG. 5D or FIG. 6C (structure in which the circumferential portions of the top surfaces of the conductive layers 15A and the side surfaces near the circumferential portions are removed to leave tapered forms, and the Cu posts 15 are thus formed) is prepared.

Subsequently (FIG. 9B), the portions of the mask which cover the leading ends 15a of the Cu posts (metal (Ti) layer 35A or metal (Ni) layer 36) are removed by wet etching processing or the like.

Figure 8A:
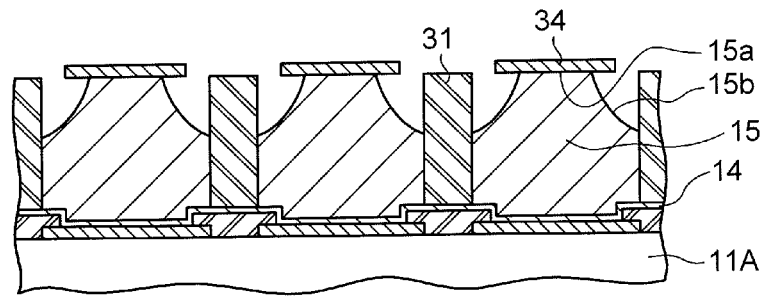
FIGS. 8A to 8D are cross-sectional views illustrating steps according to another embodiment in which a surface treatment is applied to Cu posts.
Figure 8B:
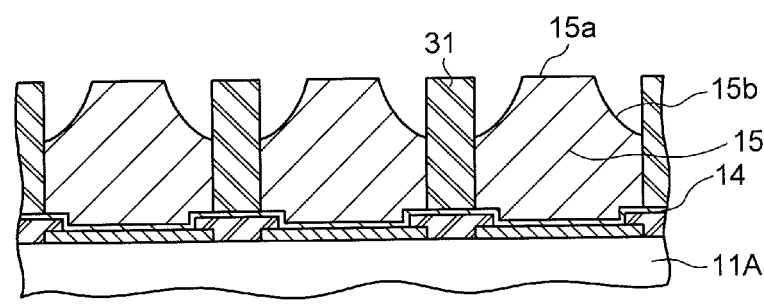
Figure 8C:
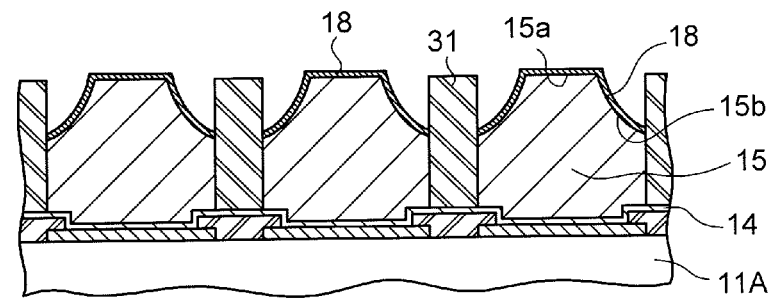
Figure 8D:
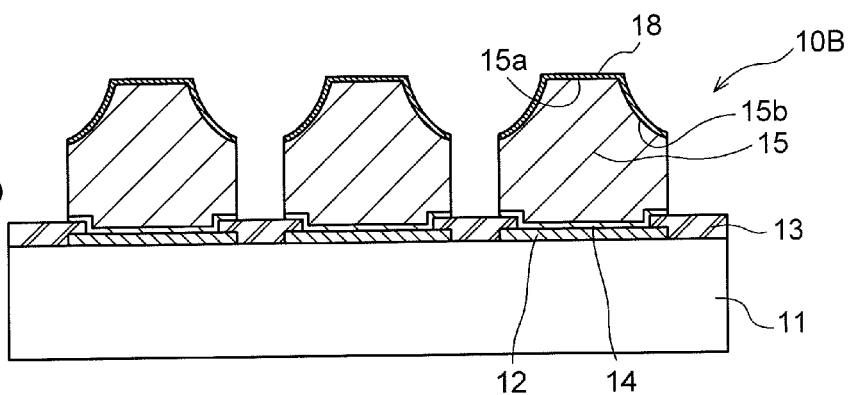

Next (FIG. 9C), in the same manner as the processing performed in the step in FIG. 8C, the metal layer (plating layer) 18 is formed on the exposed portion of each of the Cu posts 15 (the side surfaces 15b each shaped in a tapered form and the surfaces of the leading ends 15a) by electrolytic plating using the seed layer 14 as a power feeding layer.

Figure 9D:
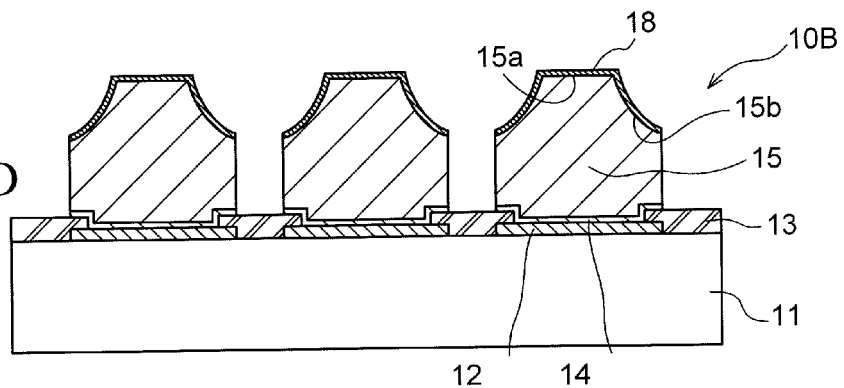

Finally (FIG. 9D), in the same manner as the processing performed in the step in FIG. 8D, a plating resist (resist layer 31A) is first removed. Thereafter, the portions of the seed layer (Ti/Cu) 14 which are exposed from the base portions of the posts 15 are removed. Then, after the back surface of the substrate 11A is polished as appropriate, the substrate 11A is diced into individual device units. As a result, the same chip (semiconductor element 10B) as one illustrated in FIG. 8D can be obtained.

In the aforementioned embodiments, descriptions are given of the case where the post-shaped connection terminals (posts) 15 are provided respectively on the pads 12 of the semiconductor element 10 (10A or 10B). However, the posts 15 are not required to be provided directly on the pads 12. For example, the following configuration is possible. An insulating layer made of a polyimide resin, an epoxy resin or the like is formed on a semiconductor element (wafer). Then, a wiring layer to be connected to the pads 12 of the semiconductor element is formed on the insulating layer by a semi-additive process or the like. Thereafter, the post-shaped connection terminals (posts) 15 are provided on pads provided at required positions of the wiring layer.

Figure 10A:
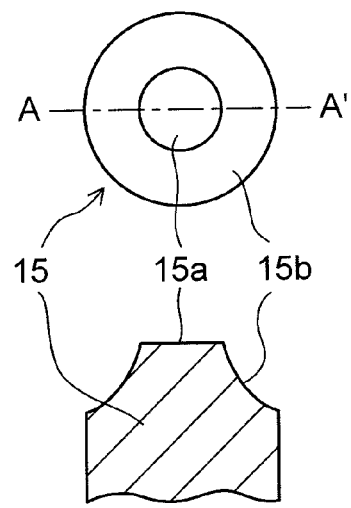
FIGS. 10A to 10C are plan views and cross-sectional views illustrating modified examples of the Cu post (post-shaped connection terminal) employed in each embodiment.
Figure 10B:
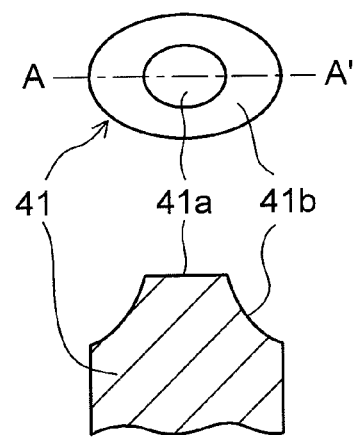
Figure 10C:
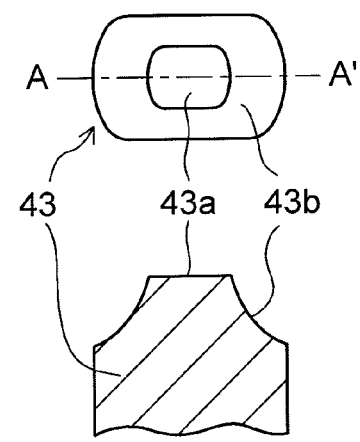

Moreover, in the aforementioned embodiments, descriptions are given of the case where the shape of the post-shaped connection terminal (post) 15 is circular when viewed in plan (see FIG. 10A). It is of course, however, that the shape is not restricted to "circular". For example, as illustrated in FIG. 10B, the post-shaped connection terminal 41 (leading end 41a, side surface 41b) may be formed so that the shape thereof is elliptic when viewed in plan. Alternatively, as illustrated in FIG. 10C, the post-shaped connection terminal 43 (leading end 43a, side surface 43b) may be formed so that the shape thereof is a combination of one rectangle and two arcs when viewed in plan. More specifically, the opposite sides of the rectangle are shaped in arc, respectively.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions, and alterations could be made hereto without departing from the spirit and scope of the invention.

What is claimed is:

1. A semiconductor element comprising a post-shaped connection terminal,
    the connection terminal having such a shape that a transverse cross-sectional area in a portion near a leading end thereof decreases toward the leading end,
    wherein the shape of the connection terminal is columnar, and a whole cross-sectional face of the connection terminal has a circular shape, and the connection terminal is formed of a copper plating layer, and a side surface near a leading end of the connection terminal has a recessed shape curved in an axial direction of the connection terminal, an outer face of the recessed shape of the connection terminal is curved over the whole side surface near the leading end of the connection terminal.

2. The semiconductor element according to claim 1, wherein the shape of the connection terminal is columnar except for the portion near the leading end, and a side surface of the connection terminal in the portion near the leading end is shaped in a tapered form.

3. The semiconductor element according to claim 2, wherein a metal layer is formed on the side surface shaped in the tapered form, of the connection terminal.

4. The semiconductor element according to claim 3, wherein the metal layer is further formed on a surface of the leading end of the connection terminal.

5. A semiconductor element mounted board comprising:
a semiconductor element including a post-shaped connection terminal having such a shape that a transverse cross-sectional area in a portion near a leading end thereof decreases toward the leading end,
wherein the shape of the connection terminal is columnar, and a whole cross-sectional face of the connection terminal has a circular shape, and the connection terminal is formed of a copper plating layer,
a side surface near a leading end of the connection terminal has a recessed shape curved in an axial direction of the connection terminal, an outer face of the recessed shape of the connection terminal is curved over the whole side surface near the leading end of the connection terminal; and
a wiring board on which the semiconductor element is mounted via the connection terminal, and the wiring board having a pad and a solder resist layer which exposes an area of the pad corresponding to the leading end of the connection terminal and which covers over area, on a surface of the wiring board,
wherein the leading end of the connection terminal is connected to a surface of the pad exposed from the solder resist layer via a solder, and the solder intervenes between the pad, and the leading end of the connection terminal opposed to the pad and the outer face of the recessed shape of the connection terminal.

* * * * *